(12) United States Patent  (10) Patent No.: US 7,696,532 B2
Knapp et al.  (45) Date of Patent: Apr. 13, 2010

(54) POWER SEMICONDUCTOR MODULE

(75) Inventors: Wolfgang Knapp, Lenzburg (CH);
Stefanie Apeldoorn, Lengnau (CH)

(73) Assignee: ABB Research Ltd, Zurich (CH)

( * ) Notice: Subject to any disclaimer, the term of this patent is extended or adjusted under 35 U.S.C. 154(b) by 493 days.

(21) Appl. No.: 11/304,703

(22) Filed: Dec. 16, 2005

(65) Prior Publication Data

US 2006/0138452 A1  Jun. 29, 2006

(30) Foreign Application Priority Data

Dec. 16, 2004  (EP)  ................... 04405776

(51) Int. Cl.
*H01L 31/111* (2006.01)
(52) U.S. Cl. ................ 257/177; 257/718; 257/E23.088
(58) Field of Classification Search ................ 257/117, 257/718, E23.088
See application file for complete search history.

(56) References Cited

U.S. PATENT DOCUMENTS

| | | | |
|---|---|---|---|
| 3,715,632 A * | 2/1973 | Warburton | ................ 257/727 |
| 4,392,153 A | 7/1983 | Glascock, II et al. | |
| 4,731,644 A * | 3/1988 | Neidig | ................. 257/687 |
| 5,132,777 A | 7/1992 | Kloucek | |
| 2003/0122261 A1 | 7/2003 | Bijlenga et al. | |
| 2004/0070060 A1 | 4/2004 | Mamitsu et al. | |

FOREIGN PATENT DOCUMENTS

| | | |
|---|---|---|
| DE | 8909971 | 8/1989 |
| DE | 197 07 514 A1 | 8/1998 |
| EP | 0921565 | 6/1999 |
| EP | 1 253 637 A2 | 10/2002 |

* cited by examiner

*Primary Examiner*—Leonardo Andújar
(74) *Attorney, Agent, or Firm*—Buchanan Ingersoll & Rooney PC

(57) ABSTRACT

A power semiconductor module (1) with a housing (2) and at least one semiconductor chip (3, 3') located in it is devised. At least one semiconductor chip (3, 3') has a first main electrode side (31) and a second main electrode side (32) opposite the first main electrode side, the first main electrode side (31) making thermal and electrical contact with the first base plate (4, 4'). The first cooling device (6) makes thermal and electrical contact with the side of the first base plate (41) facing away from the first main electrode side. The second main electrode side (32) makes thermal and electrical contact with a second base plate (5, 5'). A second cooling device (7) makes thermal contact with the side of the second base plate (51) facing away from the second main electrode side. The heat sink (65) of the first cooling device is supported against the housing (2).

31 Claims, 3 Drawing Sheets

US 7,696,532 B2

POWER SEMICONDUCTOR MODULE

TECHNICAL DOMAIN

The invention relates to the area of power semiconductor engineering. It proceeds from a power semiconductor module as claimed in the preamble of claim 1.

PRIOR ART

Document EP 0 921 565 A2 discloses a plastic-encapsulated semiconductor module with a housing in which the semiconductor chips with a first main electrode side are electrically connected among one another with bonding wires. On the second side facing away from the first main electrode side there is a copper layer, on it a board of insulating substrate and on the latter in turn a cooling sheet. The cooling sheet is thermally connected to the board of insulating material. Typically the side of the cooling sheet facing away from the insulator is thermally connected to a heat sink via which heat is dissipated. Perpendicular to the first main side external power leads are mounted on the semiconductor chip or the copper layer. The housing consists of an insulating thermoplastic material. Usually the housings are also made from another polymer material. The housing surrounds the semiconductor arrangement except for the ends of the power leads and except for the side of the cooling sheet facing away from the insulator. This housing is typically produced in a casting mold. For larger semiconductor modules or larger housings, arrangements with plastic-encapsulated semiconductor housings become very expensive because the casting modules are expensive and much expensive thermoplastic or polymer material is necessary. The one-sided cooling of these semiconductor modules cannot optimally dissipate heat; this limits the power range of the semiconductor modules.

US 2004/0070060 describes a power semiconductor module with two semiconductor chips and cooling plates which are located on the two main sides of the chips and which have projecting parts, and via the latter are connected both thermally and also electrically to the main sides of the semiconductor chip. The cooling plates are each connected on the side opposite the semiconductor chips to an electrically conductive plate via which the chips make contact from the outside. These electrically conductive plates are each connected to a thermally conductive and electrically insulating layer which are in turn in contact with the heat sink. The heat sinks are screwed to one another from the outside so that all components lying in between are pressed firmly together. Thus the pressure is transferred from the heat sinks to all components which are located in between. Since the heat sinks are screwed together with screws which are located outside, there is the danger that they will sag toward the middle, i.e. just in the area in which good contact is necessary for heat transfer.

DESCRIPTION OF THE INVENTION

The object of the invention is therefore to devise a power semiconductor module which has improved cooling relative to the prior art.

This object is achieved as claimed in the invention by the features of the independent claim 1.

The power semiconductor module as claimed in the invention has at least one semiconductor chip with a first main electrode side and a second main electrode side opposite the first main electrode side. The first main electrode side makes thermal and electrical contact with the first base plate. This first base plate makes thermal contact with a first cooling device on the side of the first base plate facing away from the first main electrode side. The first cooling device has a first main electrode connecting element and a heat sink, the first main electrode connecting element making thermal and electrical contact with the side of the first base plate facing away from the first main electrode side, and the heat sink making thermal contact with the side of the first main electrode connecting element facing away from the first main electrode side. The second main electrode side as claimed in the invention makes thermal and electrical contact with a second base plate. This second base plate makes thermal contact with the second cooling device on the side of the second base plate facing away from the second main electrode side. The power semiconductor module as claimed in the invention has a housing in which at least one semiconductor chip and the first and second cooling device are located, the heat sink of the first cooling device being supported against the housing. The power semiconductor module as claimed in the invention has very good cooling, since heat can be dissipated on the two main electrode sides of the semiconductor chip. Since the pressure is transferred from the outside to the arrangement with the two cooling devices, base plates and semiconductor chips, good thermal and optionally also electrical contact on all contact surfaces can be achieved and thus good heat dissipation can be obtained. By supporting at least one heat sink 65, 75 against the housing 2 the semiconductor module 1 becomes mechanically stable, for example against impacts and vibrations. The semiconductor module as claimed in the invention can be built compactly and it suited for the high power range.

These and other objects, advantages and features of this invention become apparent from the following detailed description of preferred embodiments of the invention in conjunction with the drawings.

Figure 1:
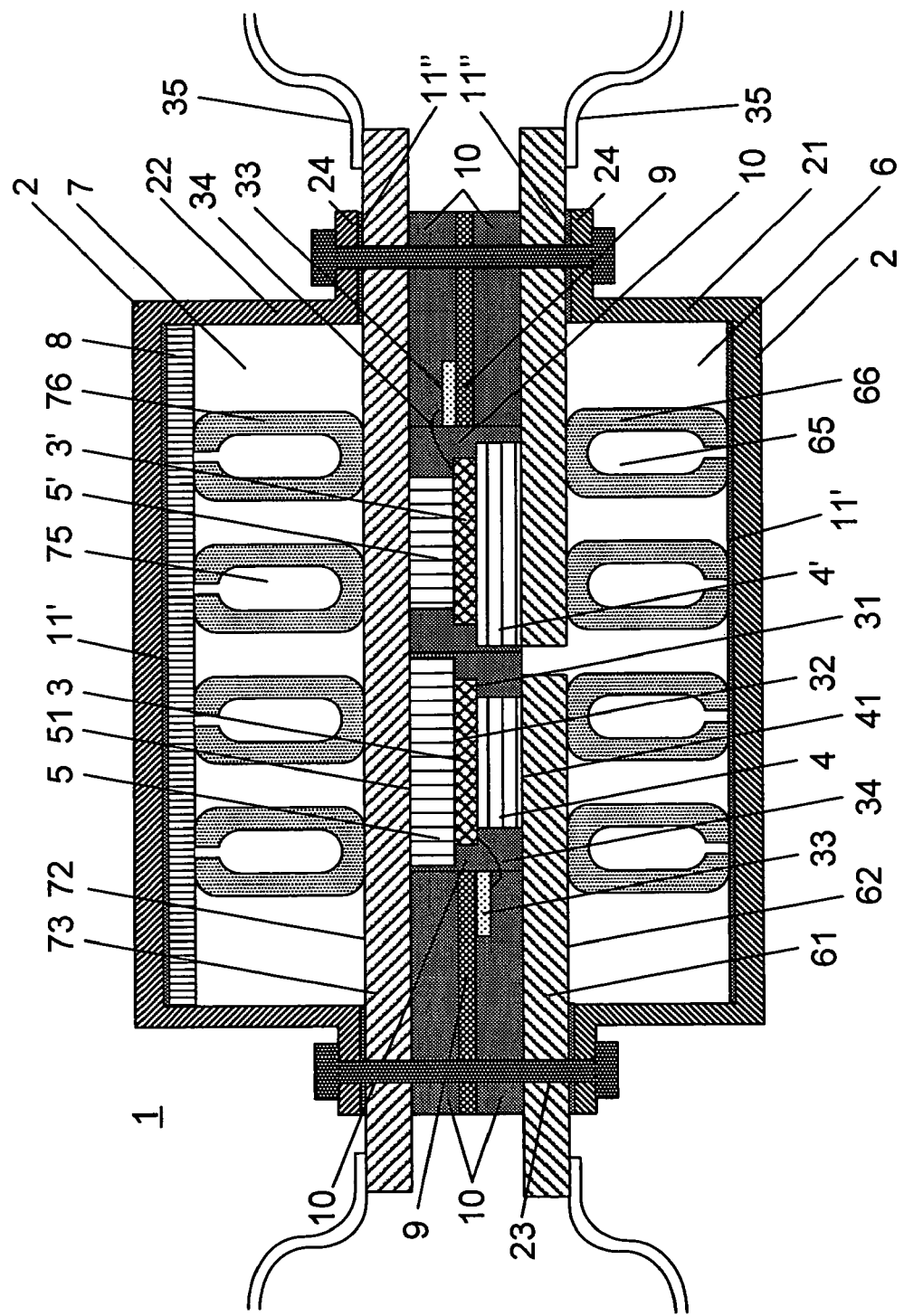
FIG. 1 shows a cross section of a first embodiment of a power semiconductor module as claimed in the invention.

The reference numbers used in the drawings are listed in summary form in the reference number list. Basically the same parts are provided with the same reference numbers in the drawings. The described embodiments for example stand for the subject matter of the invention and do not have any limiting effect.

EMBODIMENTS OF THE INVENTION

FIG. 1 shows a cross section of a first embodiment of a power semiconductor module as claimed in the invention. The power semiconductor module 1 as claimed in the invention as shown in FIG. 1 has a housing 2 with a first housing part 21 and a second housing part 22 in which there is at least one semiconductor chip 3, 3'. At least one semiconductor chip 3, 3' has a first main electrode side 31 and a second main electrode side 32 opposite the first main electrode side. The first main electrode side 31 makes thermal and electrical contact with a first base plate 4, 4'. A first cooling device 6 makes thermal contact with the side of the first base plate 41 facing away from the first main electrode side. The second main electrode side 32 makes thermal and electrical contact with a second base plate 5, 5'. A second cooling device 7 makes thermal contact with the side of the second base plate 51 facing away from the second main electrode side.

Different types of semiconductor chips 3, 3' such as rectifier diodes or free-wheeling diodes, switches such as IGBTs (insulated gate bipolar transistors), FETs (field effect transistors), BTs (bipolar transistors), a combination of a diode with a switch or reversed blocking switches can be used.

Electrical contact can be made preferably by a material connection, such as a solder connection, but also as a pressure contact. Thermal contact-making is likewise preferably achieved with a solder connection or as a pressure contact with heat conductive paste.

As shown in FIG. 1, the first cooling device 6 comprises a first main electrode connecting element 61 which makes electrical and thermal contact with the side of the first base plate 41 facing away from the first main electrode side. The second cooling device 7 comprises a second main electrode connecting element which likewise makes thermal and electrical contact with the side of the second base plate 51 facing away from the second main electrode side. In FIG. 1 the second main electrode connecting element is made as a second main electric terminal board 73 which makes thermal and electrical contact with at least two semiconductor chips 3, 3'. Other alternatives are described in the embodiments for FIG. 2. The first main electrode connecting elements 61 and the second main electrode connecting elements make both thermal and electrical contact with the semiconductor chip 3, 3' so that the structure of the power semiconductor module 1 is simple. The first and the second main electrode connecting elements make contact by external terminal conductors 35. Between the first and second main electrode connecting elements and at least one semiconductor chip 3, 3' electrically insulating layers by which the heat dissipation is adversely affected are unnecessary. Since the power current does not flow through the wires, but through the base plates 4, 4', 5, 5' and the first and second main electrode connecting elements 61, the impedance for contact-making is small and thus the power semiconductor module 1 is suited for the high power range.

To prevent unwanted currents, there is an insulator 10 between the first and second main electrode connecting elements 61 and in the case of several semiconductor chips 3, 3', between adjacent semiconductor chips 3, 3'. The insulator can be made in one piece or several pieces. The coefficient of expansion of the insulator 10 is advantageously adapted to that of the semiconductor chip 3, 3'. The insulator 10 can consist for example of a filled epoxy resin with inorganic filler material.

The first cooling device 6 as shown in FIG. 1 comprises a heat sink 65 which makes thermal contact with the side of the first main electrode connecting element 62 facing away from the first main electrode side. In addition, cooling fluids such as cooling liquids or gases, especially air, can be routed through the heat sink 65 in order to rapidly dissipate a large amount of heat. In order to create a good thermal transition, a heat conductive paste can be placed between the heat sink 65 and the first main electrode connecting element 61. Alternatively, the heat sink 65 can also be thermally connected to the first main electrode connecting element 61 by means of a solder connection. It is likewise conceivable to produce the heat sink 65 and the first main electrode connecting element 61 from one piece, for example from an extruded aluminum section, so that a thermal transition between the heat sink 65 and the first main electrode connecting element 61 is eliminated. The heat sink 65 which is made in one piece in this way and the first main electrode connecting element 61 can efficiently dissipate the heat which forms in at least one semiconductor chip 3, 3', because contact surfaces which could degrade heat transmission are eliminated.

The second cooling device 7 comprises a heat sink 75 which makes thermal contact with the side of the second main electrode connecting element 72 which faces away from the second main electrode side. In addition, cooling fluids such as cooling liquids or gases, especially air, can be routed through the heat sink 75 in order to rapidly dissipate a large amount of heat. In order to create a good thermal transition, a heat conductive paste can be placed between the heat sink 75 and the second main electrode terminal board 73. Alternatively the heat sink 75 can also be thermally connected to the second main electrode terminal board 73 by means of a solder connection. It is likewise conceivable to produce the heat sink 75 and the second main electrode terminal board 73 from one piece, for example from an extruded aluminum section so that the thermal transition between the heat sink 75 and the second main electrode connecting element is eliminated. The heat sink 75 which is made in one piece in this way and the second main electrode connecting element can efficiently dissipate the heat which forms in at least one semiconductor 3, 3', because contact surfaces which could degrade heat transmission are eliminated. In addition to making thermal contact, the heat sink 75 can also make electrical contact with the second main electrode connecting element. In this case there are no electrically insulating elements between the first semiconductor chip 3, 3' and the heat sink 75 which degrade the thermal transition. Alternatively, the heat sink 75 of the second cooling device 7 is electrically insulated relative to the second main electrode connecting element. In this case the heat sink 75 does not need to be insulated relative to the environment. In one version as shown in FIG. 1 it is possible for the two cooling devices 6, 7 to comprise heat sinks 65, 75 so that a very large amount of heat can be quickly dissipated from at least one semiconductor chip 3, 3'.

At least one heat sink 65, 75 is supported, as shown in FIG. 1, against the housing 2. By supporting at least one heat sink 65, 75 against the housing 2, the semiconductor module 1 becomes mechanically stable, for example against impacts and vibrations.

In FIG. 1 the heat sink 65, besides making thermal contact, also makes electrical contact with the first main electrode connecting element 61. In this case there are no electrically insulating elements which degrade the thermal transition located between at least one semiconductor chip 3, 3' and the heat sink 65 of the first cooling device 6. Likewise the heat sink 75, besides making thermal contact, also makes electrical contact with the second main electrode terminal board 73. The heat sinks 65, 75 are insulated by insulators 11' and 11" relative to the housing 2, the insulator 11' being located between the heat sink 65, 75 of the first and second cooling device 6, 7 and the housing 2, and the insulator 11" being located between the first main electrode connecting element 61 or the second main electrode terminal board 73 and the housing 2.

Figure 3:
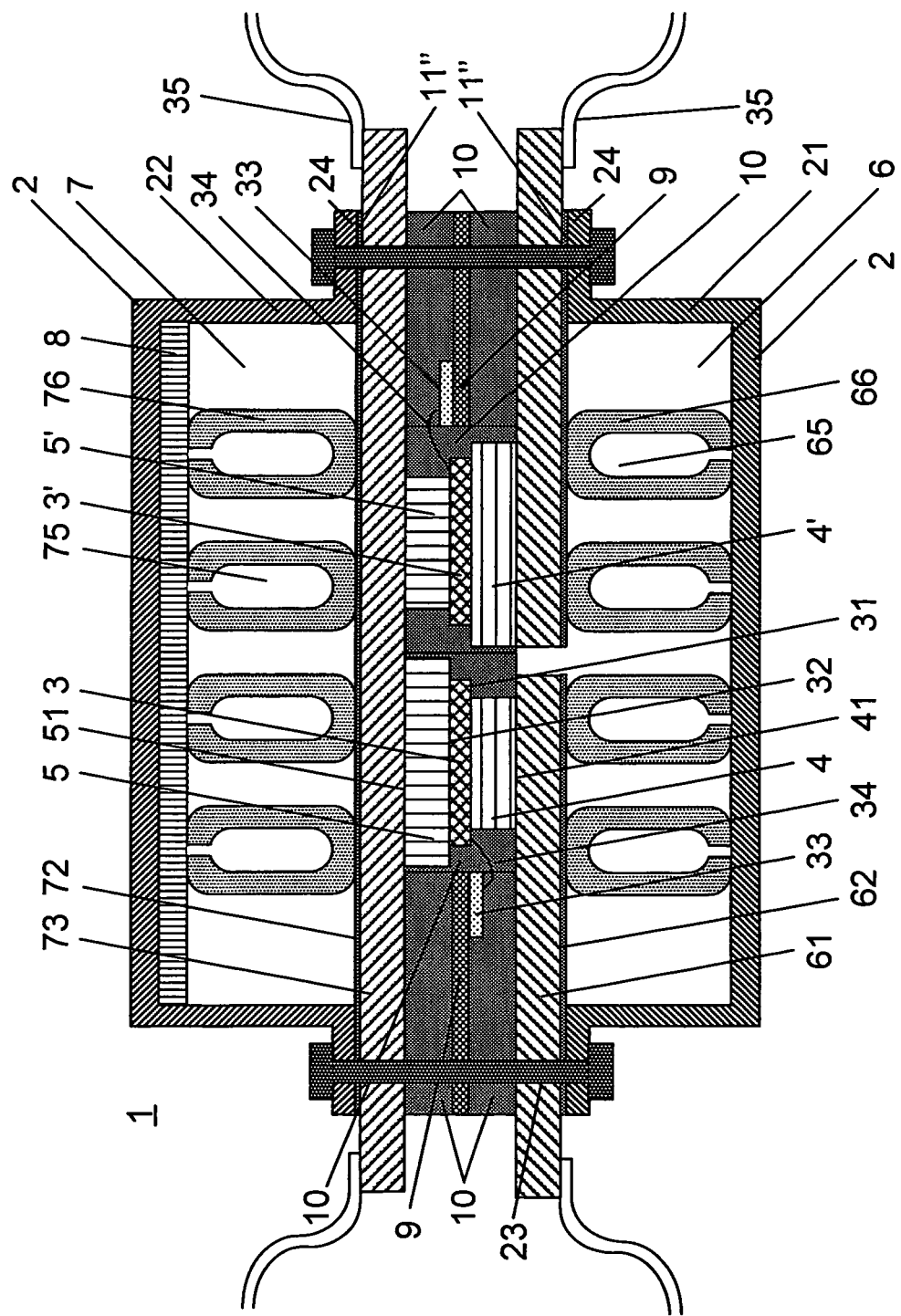
FIG. 3 shows a cross section of another embodiment of a power semiconductor module as claimed in the invention.

FIG. 3 shows another embodiment of the inventive subject matter in which the heat sink 65 of the first cooling device 6 is electrically insulated relative to the first main electrode connecting element 61, shown in FIG. 3 by an insulator 11. In this case the heat sink need not be insulated relative to the environment. Likewise the heat sink 75 of the second cooling device 7 is electrically insulated relative to the second main electrode terminal board 73, shown in FIG. 3 by the insulator 11. Alternatively it is also possible for the first main electrode connecting element 61 relative to the heat sink 65 of the first cooling device 6 and the heat sink 75 of the second cooling device 7 to be insulated relative to the housing 2 or vice versa.

Here it is decisive simply that the first main electrode connecting element 61 and the second main electrode terminal board 73 are arranged insulated from the housing 2.

The insulators 11, 11' and/or 11" can be for example a board of insulating material such as plastic. With these insulators the semiconductor module 1 is insulated relative to the environment and the installation of such a semiconductor module 1 for example in a converter is simple.

It is advantageous if the heat sink 65 of the first cooling device 6, as shown in FIG. 1, comprises cooling ribs 66 so that the heat sink 65 has a large surface, by way of which a large amount of heat can be easily dissipated. It is also conceivable for the heat sink 75 of the second cooling device 7, as shown in FIG. 1, to comprise cooling ribs 76 so that the heat sink 75 has a large surface over which a large amount of heat can be easily dissipated. It is also conceivable for the heat sinks 65, 75 of the two cooling devices 6, 7 to have cooling ribs 66, 76.

In the case in which at least one of the heat sinks 65, 75 has cooling ribs 66, 76, the housing 2 can be at least partially open so that air can flow along the cooling ribs 66, 76. Thus heat can be dissipated from the cooling ribs 66, 76.

In another preferred embodiment of the subject matter as claimed in the invention as shown in FIG. 1, the housing 2 has a first housing part 21 and a second housing part 22. At least one semiconductor chip 3, 3' is surrounded with its first main electrode side 31 at least partially by the first housing part 21 and with its second main electrode side 32 at least partially by the second housing part 22. In one version, between the first cooling device 6 and the first housing part 21 there is a flexible element 8 which can be pressed together. In another version there is a flexible element 8 which can be pressed together between the second cooling device 7 and the second housing part 22 or there are flexible elements 8 which can be pressed together between each cooling device 6, 7 and the respective housing part 21, 22. The flexible element 8 which can be pressed together can be a spring element of foam or a rubber. Especially also an elastomer, polymer, plastic metal or gas compression spring element is suited as the spring element. The two housing parts 21, 22 with the components which are located in the housing parts 21, 22 can be pressed together by the flexible element 8 which can be pressed together. The housing parts 21, 22 have shoulder pieces 24 between which the first and the second main electrode connecting elements are guided to the outside. On these shoulder pieces 24 there are fixing means 23 with which the position of the components which have been pressed together and which are located in the housing parts 21, 22 can be fixed. The fixing means 24 can be screws, terminals, bent-lever closures or other elements which are suitable for this purpose. This power semiconductor module 1 is durable relative to mechanical effects such as impacts and vibrations. Since the components are pressed together in the housing 2 continuously and under pressure, a good thermal and electrical transition between the components located in the housing 2 is ensured. The flexible element 8 which can be pressed together need not be electrically conductive and is not exposed to high temperatures, since at least a high proportion of the heat generated by at least one semiconductor chip 3, 3' is dissipated by the heat sinks 65, 75. A host of flexible and economical materials can therefore be chosen for the flexible element 8.

In one preferred embodiment the flexible element 8 which can be pressed together is itself electrically insulating so that an additional insulator is not necessary between the heat sink 65, 75 and the housing 2.

In the case of several semiconductor chips 3, 3' it is possible for the semiconductor chips 3 which are located on the first and/or second base plate 4, 4', 5, 5' to be able to be pressed together jointly by a flexible element 8 which can be pressed together. Thus pressure is applied mechanically separately to each of the individual base plates 4, 4' and/or 5, 5' so that good thermal and/or electrical contact is made.

Alternatively to the flexible element 8 which can be pressed together, it is also conceivable for the cooling ribs 66 and/or the cooling ribs 76 themselves to be made elastic. This can be achieved for example by a concave, convex, or corrugated shaping of the cooling ribs 66, 76. Likewise it is alternatively conceivable for the first and/or second housing part 21, 22 to be made elastic in the case in which the housing 2 is made in two parts. This can be achieved for example by concave, convex, or corrugated shaping of the first and/or second housing part 21, 22 in the areas which can apply a spring force, which acts perpendicular to the main electrode sides 31, 32 or which has at least one spring force component acting perpendicular to the main electrode sides 31, 32 [sic]. In the case of a housing 2 made in one part it can also be made elastic.

At least one semiconductor chip 3, 3' as shown in FIG. 1 can have a control terminal 33 which leads away parallel with respect to the first or the second main electrode side 31, 32 of the pertinent semiconductor chip 3, 3'. The control terminal 33 can make electrical contact via a bonding wire 34 to a circuit board 9 which is located in the area of the plane of at least one semiconductor chip 3, 3'. Alternatively, the control terminal 33 can have punched terminal legs which can be economically produced and easily plugged onto the circuit board 9 or permanently soldered on the circuit board 9. The circuit board is electrically insulated relative to the first and the second main electrode connecting elements 61 and at least one semiconductor chip 3, 3'. With this circuit board 9 a compact semiconductor module 1 with simple wiring can be built. For the sake of clarity, it is not shown that at least one semiconductor chip 3, 3' as one version has control terminals with punched terminal legs. If each main electrode side 31, 32 is connected by one electrical contact at a time to one control terminal at a time, these control terminals can be used to easily test the semiconductor chips 3, 3' before installation in the semiconductor module 1 and they can be used to trigger the semiconductor chip 3, 3'. At least one semiconductor chip 3, 3' can also have more than one control terminal 33.

Figure 2:
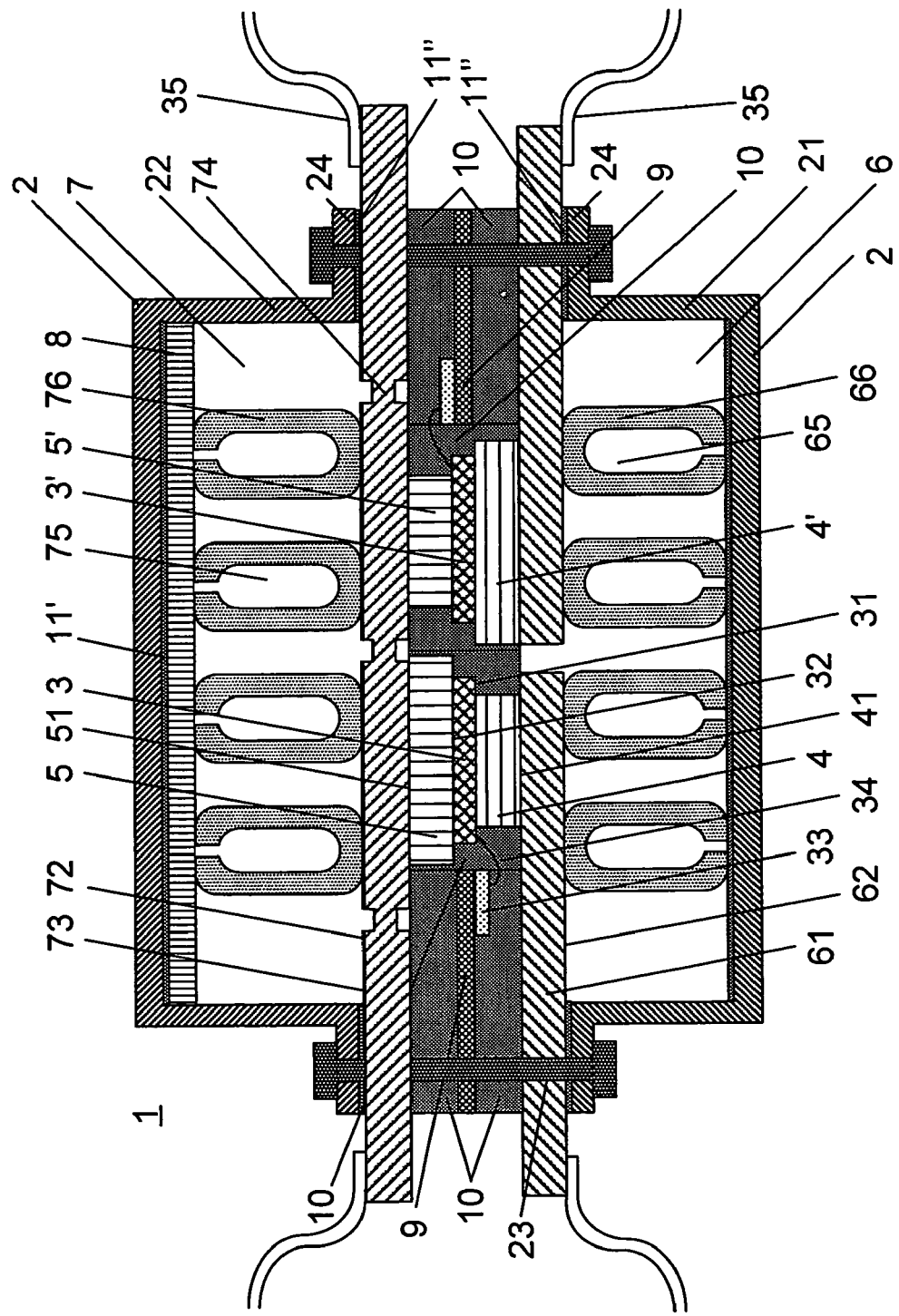
FIG. 2 shows a cross section of another embodiment of a power semiconductor module as claimed in the invention.

FIG. 2 shows another preferred embodiment of the semiconductor module 1 in which the semiconductor module 1 has at least two semiconductor chips 3, 3' and at least two first and two second base plates 4, 4', 5, 5', at least one semiconductor chip 3, 3' at a time on its main electrode sides 31, 32 making thermal and electrical contact with a first and second base plate 4, 4', 5, 5'. The respective first main electrode connecting elements 61 make electrical contact with one another or are made as a common first main electrode connecting element. The respective second main electrode connecting elements can likewise make electrical contact with one another or can be made as a common second main electrode connecting element. In cases in which there are several semiconductor chips at the same potential, in this arrangement compact semiconductor modules with a simple structure which are moreover easy to produce can be devised.

It is both conceivable for at least one semiconductor chip 3 which is located between the first and [second] base plate 4, 5 to be connected parallel or antiparallel to at least one second semiconductor chip 3 located between another first and second base plate 4', 5'. In FIG. 2 the first base plate 4 is the emitter and the pertinent second base plate 5 is the collector for the semiconductor chip 3 located between the two base plates 4, 5. Another semiconductor chip 3' is located between the first and second base plate 4', 5', the first base plate 4' here being the collector and the second base plate 5' being the emitter for the semiconductor chip 3' located between the two base plates 4', 5'. It is also conceivable for the semiconductor module 1 to have several such chip arrangements of at least one semiconductor chip 3, 3' between a first and a second base plate 4, 4', 5, 5', the semiconductors 3, 3' of some of the chip arrangements being connected in parallel and some others antiparallel, i.e. some of the base plates 4, 4' located on the first main electrode side 31 acting as a collector and some others as the emitter. The second base plates 5, 5' which are each connected by way of one semiconductor chip 3, 3' to a first base plate 4, 4' acting as the emitter act as a collector and vice versa. Thus, for example, it is possible to interconnect two adjacent chip arrangements antiparallel, and to connect chip arrangements located perpendicular thereto in the same plane parallel to the other chip arrangements which are located in the same row, so that two rows of chip arrangements are obtained, in the first row on the first main electrode side 31 there being the first base plates 4 acting only as emitters and on the second main electrode side 32 there being second base plates 5 acting only as collectors. In the second row which is parallel to the first row on the first main electrode side 31 there are first base plates 4' acting only as collectors and on the second main electrode side 32 there are second base plates 5' acting only as emitters.

In another preferred embodiment of the subject matter as claimed in the invention, at least one semiconductor chip (3) located between the first and second base plate (4, 5) is series-connected to at least one second semiconductor chip (3') located between another first and second base plate (4', 5').

In the case of a common first main electrode connecting element the common first main electrode connecting element can be made as a first main electrode terminal board. For the sake of clarity this is not shown in the figure. Between the areas in which at least two semiconductor chips 3, 3' have made contact, the first main electrode terminal board has tapers. In the case of a common second main electrode connecting element the common second main electrode connecting element as shown in FIG. 2 can be made as a second main electrode terminal board 73. Between the areas in which at least two semiconductor chips 3, 3' have made contact, the second main electrode terminal board 73 has tapers 74. It is also conceivable to provide in the power semiconductor module 1 a first common main electrode terminal board with tapers and a second common main electrode terminal board 73 with tapers 74. These tapers 74 can equalize height differences between the semiconductor chips 3, 3' or different rates of expansion in the semiconductor chips 3, 3' and the first and/or second base plate 4, 4', 5, 5' upon heating. This first and/or second main electrode terminal board 73 with tapers 74 can be used in conjunction with the flexible element 8 which can be pressed together because both the first and/or the second main electrode terminal board 73 with tapers 74 as well as the flexible element 8 which can be pressed together make it possible to equalize height differences between the individual semiconductor chips 3, 3' or to equalize different rates of expansion in the semiconductor chips 3, 3' and the first and/or second base plate 4, 4', 5, 5' upon heating.

REFERENCE NUMBER LIST

1 power semiconductor module
2 housing
21 first housing part
22 second housing part
23 fixing means
24 shoulder piece
3,3' semiconductor chip
31 first main electrode side
32 second main electrode side
33 control terminal
34 bonding wire
35 terminal conductor
4,4' first base plate
41 side of the first base plate facing away from the first main electrode side
5,5' second base plate
51 side of the second base plate facing away from the second main electrode side
6 first cooling device
61 first main electrode connecting element
62 side of the first main electrode connecting element facing away from the first main electrode side
65 heat sink
66 cooling rib
7 second cooling device
72 side of the second main electrode connecting element facing away from the second main electrode side
73 second main electrode terminal board
74 taper
75 heat sink
76 cooling rib
8 flexible element which can be pressed together
9 circuit board
10 insulator
11, 11', 11" insulator

The invention claimed is:

1. A power semiconductor module, comprising:
at least two semiconductor chips, each semiconductor chip having a first main electrode side and a second main electrode side opposite the first main electrode side, the first main electrode side of each semiconductor chip making thermal and electrical contact with a respective first base plate, and the second main electrode side of each semiconductor chip making thermal and electrical contact with a respective second base plate,
a first cooling device with a first main electrode connecting elements and a heat sink, each first main electrode connecting element making thermal and electrical contact with the side of one of the respective first base plates facing away from the first main electrode side, and the heat sink making thermal contact with the side of the first main electrode of each semiconductor chip connecting element facing away from the first main electrode side, and
a second cooling device which makes thermal contact with the side of each respective second base plate facing away from the second main electrode side of each semiconductor chip, wherein the power semiconductor module has a housing in which the at least two semiconductor chips and the first and second cooling device are located and wherein the heat sink of the first cooling device is supported against the housing,
wherein the respective first main electrode connecting elements making electrical contact with one another or the respective first main electrode connecting elements being made as a common first main electrode connecting element.

2. The power semiconductor module as claimed in claim 1, wherein the first main electrode connecting element is electrically insulated relative to the housing.

3. The power semiconductor module as claimed in claim 2, wherein the heat sink of the first cooling device makes electrical contact with the first main electrode connecting element.

4. The power semiconductor module as claimed in claim 1, wherein the heat sink of the first cooling device is electrically insulated relative to the housing.

5. The power semiconductor module as claimed in claim 1, wherein the heat sink of the first cooling device is electrically insulated relative to the first main electrode connecting element.

6. The power semiconductor module as claimed in claim 1, wherein the heat sink of the first cooling device has cooling ribs.

7. The power semiconductor module as claimed in claim 1, wherein the second cooling device comprises a second main electrode connecting element and a heat sink which makes thermal contact with the side of the second main electrode connecting element which faces away from the second main electrode side.

8. The power semiconductor module as claimed in claim 7, wherein the heat sink of the second cooling device is supported against the housing on the side that is located opposite the second main electrode connecting element.

9. The power semiconductor module as claimed in claim 7, wherein the second main electrode connecting element is electrically insulated relative to the housing.

10. The power semiconductor module as claimed in claim 9, wherein the heat sink of the second cooling device makes electrical contact with the second main electrode connecting element.

11. The power semiconductor module as claimed in claim 7, wherein the heat sink of the second cooling device is electrically insulated relative to the housing.

12. The power semiconductor module as claimed in claim 7, wherein the heat sink of the second cooling device is electrically insulated relative to the second main electrode connecting element.

13. The power semiconductor module as claimed in claim 7, wherein the heat sink has cooling ribs.

14. The power semiconductor module as claimed in claim 7, wherein the heat sink of the second cooling device mid the second main electrode connection element are made in one piece.

15. The power semiconductor module as claimed in claim 1, wherein in the case of a common first main electrode connecting element the common first main electrode connecting element is made as a main electrode terminal board which has tapers between the areas in which the at least two semiconductor chips have made contact.

16. The power semiconductor module as claimed in claim 1, wherein one of the at least two semiconductor chips located between the first and second base plate is connected in parallel to at least another one of the at least two second semiconductor chips which is located between another first and second base plate.

17. The power semiconductor module as claimed in claim 1, wherein one of the at least two semiconductor chips located between the first and second base plate is connected antiparallel to at least another one of the at least two second semiconductor chips located between another first and second base plate.

18. The power semiconductor module as claimed in claim 1, wherein one of the at least two semiconductor chips located between the first and second base plate is series-connected to at least another one of the at least two second semiconductor chips located between another first and second base plate.

19. The power semiconductor module as claimed in claim 1, wherein the housing comprises a first housing part and a second housing part, at least of the two one semiconductor chips being surrounded with its first and its second main electrode side at least partially by one housing part at a time, and wherein between the first cooling device and the first housing part there is a flexible element on the side of the first cooling element that is located opposite the first main electrode connecting element, which flexible element can be pressed together.

20. The power semiconductor module as claimed in claim 19, wherein the flexible element which can be pressed together is a spring element, especially an elastomer, polymer, plastic metal or gas compression spring element.

21. The power semiconductor module as claimed in claim 1, wherein the housing comprises a first housing part and a second housing part, at least one of the two semiconductor chips being surrounded with its first and its second main electrode side at least partially by one housing part at a time, and wherein between the second cooling device and the second housing part there is a flexible element on that side of the first cooling element that is located opposite the first main electrode connecting element, which flexible element can be pressed together.

22. The power semiconductor module as claimed in claim 1, wherein the housing is made in one part.

23. The power semiconductor module as claimed in claim 1, wherein the housing is made elastic such that a spring force component acts perpendicular to the main electrode sides.

24. The power semiconductor module as claimed in claim 1, wherein the housing comprises a first housing part and a second housing part, at least one of the two semiconductor chips being surrounded with its first and its second main electrode side at least partially by one housing part at a time, and wherein the first and/or second housing part is made elastic such that a spring force component acts perpendicular to the main electrode sides.

25. The power semiconductor module as claimed in claim 1, wherein at least one of the two semiconductor chips has a control terminal which leads away parallel with respect to the first or the second main electrode side of the pertinent semiconductor chip.

26. The power semiconductor module as claimed in claim 1, wherein the heat sink of the first cooling device and the first main electrode connection element are made in one piece.

27. A power semiconductor module, comprising:
at least two semiconductor chips, each semiconductor chip having a first main electrode side and a second main electrode side opposite the first main electrode side, the first main electrode side of each semiconductor chip making thermal and electrical contact with a respective first base plate, and the second main electrode side of each semiconductor chip making thermal and electrical contact with a respective second base plate,
a first cooling device with a first main electrode connecting elements and a heat sink, each first main electrode connecting element making thermal and electrical contact with the side of one of the respective first base plates facing away from the first main electrode side, and the heat sink making thermal contact with the side of the first main electrode of each semiconductor chip connecting element facing away from the first main electrode side, and
a second cooling device which makes thermal contact with the side of each respective second base plate facing away from the second main electrode side of each semiconductor chip, wherein the power semiconductor module has a housing in which the at least two semiconductor chips and the first and second cooling device are located and wherein the heat sink of the first cooling device is supported against the housing, wherein the respective second main electrode connecting elements making electrical contact with one another or the respective second main electrode connecting elements being made as a common second main electrode connecting element.

28. The power semiconductor module as claimed in claim 27, wherein in the case of a common second main electrode connecting element the common second main electrode connecting element is made as a main electrode terminal board which has tapers between the areas in which the at least two semiconductor chips have made contact.

29. A power semiconductor module, comprising:
at least one semiconductor chip which has a first main electrode side and a second main electrode side opposite the first main electrode side, the first main electrode side making thermal and electrical contact with the first base plate, and the second main electrode side making thermal and electrical contact with a second base plate,
a first cooling device with a first main electrode connecting element and a heat sink, the first main electrode connecting element making thermal and electrical contact with the side of the first base plate facing away from the first main electrode side, and the heat sink making thermal contact with the side of the first main electrode connecting element facing away from the first main electrode side, and
a second cooling device which makes thermal contact with the side of the second base plate facing away from the second main electrode side, wherein the power semiconductor module has a housing in which at least one semiconductor chip and the first and second cooling device are located and wherein the heat sink of the first cooling device is supported against the housing,
wherein at least one semiconductor chip has a control terminal which leads away parallel with respect to the first or the second main electrode side of the pertinent semiconductor chip, and
wherein the power semiconductor module comprises a circuit board, the circuit board is located in the plane of at least one semiconductor chip and the control terminal makes electrical contact with the circuit board.

30. A power semiconductor module, comprising:
at least one semiconductor chip which has a first main electrode side and a second main electrode side opposite the first main electrode side, the first main electrode side making thermal and electrical contact with the first base plate, and the second main electrode side making thermal and electrical contact with a second base plate,
a first cooling device with a first main electrode connecting element and a heat sink, the first main electrode connecting element making thermal and electrical contact with the side of the first base plate facing away from the first main electrode side, and the heat sink making thermal contact with the side of the first main electrode connecting element facing away from the first main electrode side, and
a second cooling device which makes thermal contact with the side of the second base plate facing away from the second main electrode side, wherein the power semiconductor module has a housing in which at least one semiconductor chip and the first and second cooling device are located and wherein the heat sink of the first cooling device is supported against the housing,
wherein the second cooling device comprises a second main electrode connecting element and a heat sink which makes thermal contact with the side of the second main electrode connecting element which faces away from the second main electrode side,
wherein the heat sink of the second cooling device is supported against the housing on the side that is located opposite the second main electrode connecting element, and
wherein the housing comprises a first housing part and a second housing part, at least one semiconductor chip being surrounded with its first and its second main electrode side at least partially by one housing part at a time, and wherein the cooling ribs are made elastic.

31. A power semiconductor module, comprising
at least one semiconductor chip which has a first main electrode side and a second main electrode side opposite the first main electrode side, the first main electrode side making thermal and electrical contact with the first base plate, and the second main electrode side making thermal and electrical contact with a second base plate,
a first cooling device with a first main electrode connecting element and a first heat sink, the first main electrode connecting element making thermal and electrical contact with the side of the first base plate facing away from the first main electrode side, and the first heat sink making thermal contact with the side of the first main electrode connecting element facing away from the first main electrode side, and
a second cooling device which makes thermal contact with the side of the second base plate facing away from the second main electrode side, wherein the power semiconductor module has a housing in which at least one semiconductor chip and the first and second cooling device are located and wherein the first heat sink of the first cooling device is supported against the housing,
wherein the second cooling device comprises a second main electrode connecting element and a second heat sink which makes thermal contact with the side of the second main electrode connecting element which faces away from the second main electrode side,
wherein the second heat sink has cooling ribs, and
wherein the housing comprises a first housing part and a second housing part, at least one semiconductor chip being surrounded with its first and its second main electrode side at least partially by one housing part at a time, and wherein the cooling ribs are made elastic.

* * * * *